United States Patent [19]

Verzemnieks

[11] Patent Number: 4,579,699

[45] Date of Patent: Apr. 1, 1986

[54] METHOD FOR MAKING α-SI$_3$N$_4$ WHISKERS AND ARTICLES THEREFROM

[75] Inventor: Juris Verzemnieks, Tacoma, Wash.

[73] Assignee: The Boeing Company, Seattle, Wash.

[21] Appl. No.: 536,962

[22] Filed: Sep. 29, 1983

[51] Int. Cl.$^4$ .............................................. C01B 21/06
[52] U.S. Cl. ........................................ 264/43; 264/49; 264/62; 264/82; 264/133; 264/332; 264/DIG. 19; 501/154
[58] Field of Search .................... 264/60, 63, 62, 65, 264/43, 49, 82, 133, 332; 501/154

[56] References Cited

U.S. PATENT DOCUMENTS

| | | | |
|---|---|---|---|
| 2,618,565 | 11/1952 | Nicholson | 264/65 |
| 3,084,998 | 4/1963 | Dess . | |
| 4,017,319 | 4/1977 | Gresovich et al. . | |
| 4,036,653 | 7/1977 | Jacobson | 264/65 |
| 4,073,845 | 2/1978 | Buljan et al. . | |
| 4,101,616 | 2/1978 | Buljan . | |
| 4,122,152 | 10/1978 | Mori et al. . | |
| 4,122,155 | 10/1978 | Prochazka et al. . | |
| 4,125,592 | 11/1978 | Ezis et al. . | |
| 4,177,230 | 12/1979 | Mazdiyashi | 264/65 |
| 4,388,255 | 6/1983 | Simpson | 264/60 |

FOREIGN PATENT DOCUMENTS

| | | |
|---|---|---|
| 2356921 | 5/1974 | Fed. Rep. of Germany . |
| 1274212 | 5/1972 | United Kingdom . |
| 1490543 | 11/1977 | United Kingdom . |

*Primary Examiner*—Philip Anderson
*Attorney, Agent, or Firm*—Finnegan, Henderson, Farabow, Garrett & Dunner

[57] ABSTRACT

A method for producing α-silicon nitride whiskers. Silicon is blended with amorphous silicon nitride and a pore-forming composition particles able to be removed without leaving a residue, such as naphthalene particles. The mixture is compacted to a desired shape, after which the pore-forming particles are removed from the mixture to form a porous silicon precursor compact having the desired shape. The silicon precursor is reacted with a substance that releases free nitrogen, such as nitrogen or dry ammonia. The reaction is carried out at a temperature sufficiently high to form an identically shaped porous compact of α-silicon nitride whiskers but sufficiently low to avoid subliming substantially all of the formed whiskers. Preferably, the reaction is carried out in a range between about 1100° C. and 1500° C. The shaped porous compact of α-silicon nitride whiskers may be impregnated with a resin binder, a liquid metal, a colloidal suspension, an ionic solution or a gaseous material to form a composite. Alternatively, the compact of α-silicon nitride whiskers formed by the method described above may be broken down by crushing or grinding to form individual whiskers.

25 Claims, No Drawings

METHOD FOR MAKING α-SI₃N₄ WHISKERS AND ARTICLES THEREFROM

BACKGROUND OF THE INVENTION

This invention relates to a method for producing low density α-silicon nitride pre-shaped whisker compacts in which the whiskers can be used as the high modulus high-strength reinforcing phase for metal, organic and ceramic matrix phase composites. The invention also relates to a method for producing α-silicon nitride whiskers for blending with metal, organic and ceramic molding powders to provide a high-strength, high-modulus reinforcing phase for composite parts.

This invention is an improvement that the invention disclosed in U.S. Pat. No. 4,388,255 to Simpson.

The development of fiber reinforced composites has created a demand for reinforcement in the form of elongated, single-crystal fibers known as whiskers. The term whiskers generally applies to any single-crystal fiber having a thickness less than 0.1 mm. and a length to thickness ratio of at least 100.

Whiskers are potentially important in the reinforcement of metals and other materials because of their shape, high-modulus of elasticity and high tensile strength. When dispersed in metals, the elongated shape of whiskers renders them difficult particles to displace to the grain boundaries, thus significantly increasing the creep resistance of the metal. Further, the high elastic modulus and tensile strength of many whiskers makes it possible for them to act as reinforcement for producing materials having superior strength to weight and stiffness to weight properties.

Whiskers can be made from very stiff and light covalent compounds such as carbides, nitrides and oxides, which have elastic moduli higher than most metals and are also often many times stronger than steel, especially in proportion to their weight.

α-Silicon nitride is known to be a highly desirable reinforcement material which does not react chemically with matrix materials. A number of prior art attempts, however, to produce whiskers of α-silicon nitride have been extremely costly. Accordingly, the art has sought an improved method for producing α-silicon nitride whiskers where the resulting product has a high proportion of whiskers to other non-fiberous and less desirable shapes. Furthermore, a method of forming a low density body of silicon nitride that can be infiltrated with a matrix material to form a composite member is also of significant commercial significance.

SUMMARY OF THE INVENTION

The present invention overcomes the problems and disadvantages of the prior art by producing α-silicon nitride whiskers at a reasonable cost either as uniform preformed compacts ready for use as high temperature insulation having structural capabilities or for infiltration by a binder matrix phase or as individual particles for blending with molding powders. Therefore, an object of the present invention is to produce α-silicon nitride whiskers at a reasonable cost as either a low density shaped preform or as individual whiskers. This is accomplished by blending silicon particles with amorphous $Si_3N_4$ and a particulate pore-forming material that can be removed without leaving a residue. Compacting the blend of silicon particles, amorphous $Si_3N_4$ and the particulate pore former to a shaped preform, is followed by removing the pore-forming material from the mixture. This produces a shaped porous precursor. The precursor shape can then be reacted with nitrogen containing gas to form a similarly shaped compact of α-silicon nitride whiskers. The shaped whisker compact can be impregnated with various materials to form dense fiber reinforced shaped composites. Alternatively, the shaped compact may be broken down to form individual whiskers useful as reinforcement for metal, ceramic or resin molding powders.

Additional objects and advantages of the invention will be set forth in part in the description which follows, and in part will be obvious from the description or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method for producing a pre-shaped compact of low density α-silicon nitride whiskers according to the present invention comprises the steps of (a) mixing silicon particles with amorphous silicon nitride and a pore-forming composition that can be removed without leaving a residue; (b) compacting the mixture to a desired shape; (c) removing the pore-forming composition from the mixture to form a porous precursor having the desired shape; and (d) reacting the porous precursor with a substance that releases free nitrogen, the reaction occurring at a temperature sufficiently high to convert the shaped compact to the identically shaped porous compact of α-silicon nitride whiskers but sufficiently low to avoid subliming substantially all of the formed whiskers.

Further to achieve the foregoing objects and in accordance with the purpose of the invention, as embodied and broadly described herein, the method for producing composites reinforced by α-silicon nitride whiskers according to the present invention comprises impregnating the shaped porous compact of α-silicon nitride whiskers with a material selected from the group consisting of a resin binder, a liquid metal, a colloidal suspension, an ionic salt solution and at least one gaseous material to form a composite reinforced by α-silicon nitride.

Still further to achieve the foregoing objects and in accordance with the purpose of the invention, as embodied and broadly described herein, the method for producing individual α-silicon nitride whiskers according to the present invention comprises the steps of (a) mixing silicon particles in powder form with from about 5 to 50% amorphous silicon nitrides and about 5 to 90 weight percent of a particulate pore-forming composition able to be removed from the mixture without leaving a residue; (b) compacting the mixture; (c) removing the pore-forming composition from the mixture to form a loosely-compacted silicon precursor; (d) reacting the silicon precursor with a substance that releases free nitrogen, the reaction occurring at a temperature sufficiently high to convert the loosely-compacted silicon precursor to loosely-compacted α-silicon nitride whiskers but sufficiently low to avoid subliming substantially all of the whiskers which are formed; and (e) breaking down the loosely-compacted α-silicon nitride whiskers to obtain individual whiskers.

DETAILED DESCRIPTION OF THE PREFERRED EMBODIMENTS

Reference will now be made in detail to the presently preferred embodiments of the invention.

In accordance with the invention, silicon particles and amorphous silicon nitride are mixed with a pore-forming composition capable of being removed without leaving a residue to form a mixture. The silicon powder is conventional material for such a use and preferably it has a particle size substantially less than 35 μm. in diameter. The mixture can be a dry mixture or in the form of a slurry. While it is preferred that the silicon and amorphous silicon nitride be pre-mixed and the pore-forming composition added, the three components can be simultaneously mixed.

The amorphous silicon nitride is preferably present in an amount (with respect to the silicon only) in the range of from 95:5 to 50:50. It is further preferred that the amorphous silicon nitride be present in the lower portion of the stated range.

For blending with the silicon particles, particles of numerous compositions are able to sublime without leaving a residue, including naphthalene, camphor and carbon dioxide, provided that the carbon dioxide is maintained under cryogenic conditions, are suitable. Preferably, naphthalene particles are blended with the silicon particles.

Preferably, about 5% to 80% by weight silicon and amorphous silicon nitride particles of sufficient fineness are blended by conventional means to coat the composition particles. At least about 5% by weight silicon and amorphous silicon nitride is needed to maintain a network of the desired shape after removal of the pore-forming composition particles that is capable of subsequently reacting with free nitrogen, to form a similar shaped α-silicon nitride whisker compact. If more than 80% by weight silicon and amorphous silicon nitride particles are used, however, the matrix remaining after removal of the pore-forming composition is too dense for practical use.

The density of the compact of α-silicon nitride whiskers ultimately produced, which density controls the concentration of the reinforcing phase in the final composite, is itself controlled by varying the amount of silicon used and the ratio of silicon to amorphous silicon nitride. The amorphous silicon nitride has a significant effect on formation of the α-silicon nitride whiskers and profoundly affects the density of the article formed in accordance with the invention. Coherent articles of α-silicon nitride whiskers of densities less than 0.2 g/cm$^3$ have been produced and densities as low as 0.1 g/cm$^3$ may be achieved. The present invention finds particular utility in forming articles having densities of less than about 0.6 g/cm$^3$. In addition, the presence of the amorphous silicon nitride affects the morphology of the α-silicon nitride and results in less particulate matter being formed with the formation of whiskers.

It is preferred that the composition particles be larger than the silicon and amorphous silicon nitride particles. Since silicon and amorphous silicon nitride powders and naphthalene powders have opposite electrostatic charges, the smaller silicon particles adhere to and coat the larger naphthalene particles.

In accordance with the invention, the silicon and amorphous silicon nitride and pore-forming composition mixture is compacted to a desired shape. Conventional means may be employed, such as die pressing or hydrostatic pressing. Pressures ranging from about several hundred to 30,000 psi may be used.

In accordance with the invention, the pore-forming composition is removed from the shaped compact to leave an openly porous silicon-amorphous silicon nitride precursor compact that maintains the desired shape. For example, when naphthalene is used as the pore-former the compacts are baked at a temperature below the melting temperature of naphthalene, i.e., 80°–83° C., preferably in a vacuum. Sublimation of the naphthalene leaves a porous skeletal compact of silicon and amorphous silicon nitride.

In accordance with the invention, the porous shaped silicon-amorphous silicon nitride compact is reacted with a substance that releases free nitrogen. The reaction occurs at a temperature sufficiently high to convert the shaped silicon-amorphous silicon nitride to an identically shaped porous compact of α-silicon nitride whiskers but sufficiently low to avoid subliming substantially all of the formed whiskers.

Suitable reactive substances that release free nitrogen include nitrogen, dry ammonia, a mixture of hydrogen and dry ammonia, a mixture of nitrogen and dry ammonia, a mixture of hydrogen and nitrogen, and a mixture of nitrogen, dry ammonia and hydrogen. A preferred reactive substance is nitrogen containing from about 1 to 10 volume percent of a chemical selected from the group consisting of hydrogen and dry ammonia.

A preferred temperature range for reacting the silicon-amorphous silicon nitride compact with nitrogen is about 1100° to 1490° C. The reaction of the silicon matrix with nitrogen is carried out long enough to completely transform the silicon-amorphous silicon nitride compact to an identically shaped compact of α-silicon nitride whiskers.

In a preferred embodiment of the invention, fiber reinforced composites are formed where α-silicon nitride whiskers are the reinforcing medium. In accordance with the invention, a shaped compact of α-silicon nitride whiskers, formed as described above, is impregnated with a matrix material. Preferably, the matrix material is selected from the group consisting of resin binders, liquid metals, aqueous colloidal suspensions, ionic solutions and at least one gaseous material capable of being solidified to form a matrix.

Suitable resin binders include acrylic resins, polyimide resins, phenolic resins, epoxy resins and silicone resins. Conventional vacuum infiltration means can be utilized to put uncured resin into the porous compact of α-silicon nitride whiskers, followed by polymerization or curing of the resin within the whisker matrix by conventional means.

Suitable liquid metals include those having relatively low melting points, such as aluminum, magnesium, silver and copper. By conventional means, such as vacuum infiltration, the porous compact of α-silicon nitride whiskers is impregnated by a liquid metal. Solidification of the metal is accomplished by such means as a cooling step. For certain metals, it may be necessary to treat the liquid metal with a wetting agent, such as lithium, prior to impregnating the porous compact of whiskers, to facilitate the wetting of the whiskers by the metal.

Suitable aqueous colloidal suspensions are those having colloids small enough to penetrate the pore size of the α-silicon nitride whiskers compact. Preferred aqueous colloidal suspensions are selected from the group consisting of silica and alumina. By means such as vacuum infiltration, the whisker compact is impregnated by an aqueous colloidal suspension, followed by a drying step to remove the aqueous phase. If necessary, the dried impregnated compact can be consolidated by sintering to form the desired composite. Multiple cycles of impregnation, drying and sintering may be used to produce the desired density and strength properties.

If aqueous colloidal silica is used, the aqueous phase is removed by a drying step and then consolidated by sintering at a temperature of about 980° to 1200° C. When aqueous colloidal alumina is used, a sintering temperature of about 1370° to 1480° C. is employed for consolidating the alumina matrix phase.

Suitable ionic solutions useful in the process of the present invention include aluminum nitride, nickel chloride, boric acid and ammonia borane. After impregnation of the solution into the whisker compact by conventional means, the aqueous phase is removed by a drying step, leaving the desired residue in the whisker compact to be converted to the matrix phase.

For example, aluminum nitrate may be introduced into the whisker compact by such conventional means as vacuum infiltration, followed by a heating step to drive off water and nitrous oxide, leaving aluminum oxide reinforced by the matrix of $\alpha$-silicon nitride whiskers.

Nickel chloride may be introduced into the whisker compact by appropriate means, followed by a thermal treatment in an oxidizing atmosphere to drive off water and chlorine and produce nickel oxide residue in the whisker compact. The remaining nickel oxide can be reduced to nickel metal by an appropriate step such as firing in a reducing atmosphere containing hydrogen. Several cycles may be required to achieve the desired densities. A secondary forming step such as hot pressing may be desired for certain applications to further increase density and strength.

Suitable gaseous materials are selected from the group consisting of any gaseous material which can be cracked to convert it to a solid and at least two gaseous materials which react to form a solid material. Preferably, the gaseous material is selected from the group consisting of silicon tetrachloride, ammonia, nitrogen, hydrogen and methane. More preferably, methane gas ($CH_4$) that disassociates on striking the heated whiskers structure to form carbon (C) and silicon tetrachloride and ammonia which form silicon nitride ($Si_3N_4$) are employed. Most preferably, the gaseous material is a mixture containing at least one gaseous material selected from the group consisting of silicon tetrachloride and silicon tetrafluoride and at least one gaseous material selected from the group consisting of ammonia, nitrogen and hydrogen and further including the step of heating the porous shaped compact of $\alpha$-silicon nitride, whereby the gaseous material mixture reacts to form a dense form a silicon nitride, the silicon nitride being reinforced with $\alpha$-silicon nitride whiskers. The gaseous materials are passed through the heated whisker compact under reduced pressure.

Further, methane gas may be introduced into the $\alpha$-silicon nitride shaped whisker compact, followed by pyrolysis of the methane to form a carbon matrix reinforced by the $\alpha$-silicon nitride whiskers.

Further, any two gaseous materials which react to form a solid can be introduced into the whisker compact, followed by a reaction to form a reinforced solid.

In another preferred embodiment of the invention, individual $\alpha$-silicon nitride whiskers are produced. One may convert the compact of $\alpha$-silicon nitride whiskers, formed by the above-described method, to individual whiskers by grinding or crushing the compact. It is preferable, however, to produce a weaker, looser compact or network of $\alpha$-silicon nitride whiskers, since the weaker compact will facilitate formation of individual particles.

To accomplish this, in accordance with a preferred embodiment of the present invention, silicon and amorphous silicon nitride particles in powder form are premixed with about 20 to 90 weight percent of the above-described pore-forming composition particles which are able to be removed without leaving a residue. Preferably, the pore-forming composition particles are present in a fine form. As before, naphthalene is preferably used.

It will be apparent to those skilled in the art that various modifications and variations can be made in the method of the present invention without departing from the scope or spirit of the invention. Thus, it is intended that the present invention cover the modifications and variations of the invention provided they come within the scope of the appended claims and their equivalents.

What is claimed is:

1. A method of making a low density $\alpha$-silicon nitride article, said method comprising the steps of:
   (a) mixing particulate silicon with amorphous silicon nitride and a pore-forming composition to form a mixture, said pore-forming composition being capable of being removed without leaving a residue;
   (b) compacting the mixture to a desired shape;
   (c) removing the pore-forming composition to form a porous precursor; and
   (d) reacting said porous precursor with a gas that releases free nitrogen to convert said silicon to $\alpha$-silicon nitride while simultaneously converting said amorphous silicon nitride to $\alpha$-silicon nitride.

2. The method of claim 1 wherein said article has a density of less than 0.2 g/cm$^3$.

3. The method of claim 1 wherein said article has a density of less than 0.6 g/cm$^3$.

4. The method of claim 1 wherein said mixture comprises from 5 to 80% silicon and amorphous silicon nitride.

5. The method of claim 1 wherein the ratio of silicon powder to amorphous silicon nitride is in the range of from 95:5 to 50:50.

6. The method of claim 1 wherein said porous precursor is reacted with nitrogen at a temperature in the range of from 1100° to 1500° C.

7. The method of claim 1 wherein said gas is selected from the group consisting of nitrogen, dry ammonia, a mixture of hydrogen and dry ammonia, a mixture of nitrogen and dry ammonia, mixture of hydrogen and nitrogen, and a mixture of nitrogen, dry ammonia and hydrogen.

8. The method of claim 1 wherein said pore-forming composition is in the form of particles, said particles having a composition are selected from the group consisting of naphthalene, camphor and carbon dioxide.

9. The method of claim 1 wherein said silicon particles have a diameter of less than about 35 μm.

10. A method of making a fiber reinforced composite, said composite being reinforced by whiskers of $\Delta$-silicon nitride, said method comprising the steps of:
    (a) mixing particulate silicon with amorphous silicon nitride and a pore-forming composition to form a mixture, said pore-forming composition being capable of being removed without leaving a residue;

(b) compacting the mixture to a desired shape;

(c) removing the pore-forming composition to form a porous precursor;

(d) reacting said porous precursor with a gas that releases free nitrogen to convert said silicon to α-silicon nitride while simultaneously converting said amorphous silicon nitride to α-silicon nitride to form a porous α-silicon nitride article;

(e) impregnating said porous α-silicon nitride article with a matrix material;

(f) solidifying said matrix material to form said composite.

11. The method of claim 10 wherein said porous α-silicon nitride article has a density less than about 0.2 g/cm$^3$.

12. The method of claim 10 wherein said porous α-silicon nitride article has a density less than about 0.6 g/cm$^3$.

13. The method of claim 10 wherein said mixture comprises from 5 to 80% silicon and amorphous silicon nitride.

14. The method of claim 10 wherein said matrix material is selected from the group consisting of a resin binder, a liquid metal, a colloidal suspension, an ionic solution and at least one gaseous material capable of being solidified to form a matrix.

15. The method of claim 14 wherein said material is a resin.

16. The method of claim 15 further including the step of polymerizing the matrix material in said reinforced composite.

17. The method of claim 14 wherein said material is a liquid metal.

18. The method of claim 17 further including the step of treating said liquid metal with a wetting agent prior to said impregnating step to facilitate the wetting of said whiskers by said metal.

19. A method of forming individual α-silicon nitride whiskers, said method comprising the steps of:

(a) mixing particulate silicon with amorphous silicon nitride and a pore-forming composition to form a mixture, said pore-forming composition being capable of being removed without leaving a residue;

(b) compacting said mixture;

(c) removing the pore-forming composition to form a porous precursor;

(d) reacting said porous precursor with a gas that releases free nitrogen to convert said silicon to α-silicon nitride while simultaneously converting said amorphous silicon nitride to α-silicon nitride; and (e) breaking the bond between the individual α-silicon nitride whiskers.

20. The method of claim 19 wherein the ratio of silicon powder to amorphous silicon nitride is in the range of from 95:5 to 50:50.

21. The method of claim 19 wherein said silicon is reacted with nitrogen at a temperature in the range of from 1100° to 1500° C.

22. The method of claim 19 wherein said gas is selected from the group consisting of nitrogen, dry ammonia, a mixture of hydrogen and dry ammonia, a mixture of nitrogen and dry ammonia, mixture of hydrogen and nitrogen, and a mixture of nitrogen, dry ammonia and hydrogen.

23. The method of claim 19 wherein said pore-forming composition are in the form of particles, said particles having a composition are selected from the group consisting of naphthalene, camphor and carbon dioxide.

24. The method of claim 19 wherein said individual α-silicon nitride whiskers have a diameter of about 0.2 μm or less.

25. The method of claim 19 wherein said mixture comprises from 5 to 80% silicon and silicon nitride.

* * * * *